United States Patent [19]

Tobias et al.

[11] Patent Number: 5,002,849

[45] Date of Patent: Mar. 26, 1991

[54] RECEIVER SHEET INCLUDING AMINE SALT

[75] Inventors: Russell H. Tobias; David A. Hutchings, both of Centerville; Kelli J. Borello, Kettering, all of Ohio

[73] Assignee: The Mead Corporation, Dayton, Ohio

[21] Appl. No.: 416,174

[22] Filed: Oct. 2, 1989

[51] Int. Cl.$^5$ ........................... G03C 5/54; G03C 1/68
[52] U.S. Cl. ..................................... 430/138; 430/211; 430/253; 430/281
[58] Field of Search ............... 430/138, 253, 254, 255, 430/211, 281

[56] References Cited

U.S. PATENT DOCUMENTS

| | | | |
|---|---|---|---|
| 4,399,209 | 8/1983 | Sanders et al. | 430/138 |
| 4,483,912 | 11/1984 | Sanders | 430/138 |
| 4,784,932 | 11/1988 | Nakamura et al. | 430/203 |
| 4,859,561 | 8/1989 | Metz et al. | 430/138 |
| 4,885,227 | 12/1989 | Nakamura | 430/138 |
| 4,927,731 | 5/1990 | Takahashi | 430/138 |
| 4,933,256 | 6/1990 | Kakimi | 430/138 |

FOREIGN PATENT DOCUMENTS

D2203851 10/1988 United Kingdom .

*Primary Examiner*—Richard L. Schilling
*Attorney, Agent, or Firm*—Thompson, Hine and Flory

[57] ABSTRACT

A receiver sheet including a developer material capable of forming visible images upon reaction with a color precursor; and an amine salt capable of reacting with a photohardenable composition by a Michael addition reaction, said amine salt being associated with said receiver sheet such that said amine salt does not react with said photohardenable composition until after said color precursor has been transferred to said receiver sheet and an imaging system including said receiver sheet is provided.

8 Claims, No Drawings

RECEIVER SHEET INCLUDING AMINE SALT

BACKGROUND OF THE INVENTION

1. Field of the Invention

The present invention relates to an imaging system including a receiver sheet which is capable of providing high quality visible images through reaction with an electron donating color precursor. More particularly, the present invention provides a receiver sheet for use in an imaging system wherein the color precursor is transferred to the receiver sheet in a polymerizable activated ethylenically unsaturated material and wherein the receiver sheet includes an amine salt capable of polymerizing or otherwise sequestering excess polymerizable material by a Michael addition to convert the polymerizable material to a more desirable form.

2. Description of the Prior Art

Commonly assigned U.S. Pat. No. 4,399,209 discloses a transfer imaging system. The system comprises an imaging sheet comprising a first support having a coating on the surface thereof. The coating typically includes a photohardenable composition which is encapsulated with a color precursor. Images are formed by image-wise exposure of the microcapsule coating to actinic radiation.

After image-wise exposure, the microcapsules are ruptured. The viscosity of the photohardenable composition increases substantially upon exposure to actinic radiation through mechanisms such as cross-linking and simple polymerization. Therefore, when the microcapsules are ruptured, the photohardenable composition which received a strong exposure will flow very little if at all while the unexposed or weakly exposed photohardenable composition can flow relatively freely. In practice, the photohardenable composition typically comprises an ethyenically unsaturated compound, and more specifically an activated compound, typically a acrylate.

After image-wise exposure and microcapsule rupture, the photosensitive composition including the acrylate and the color precursor migrate to a receiver sheet which comprises a second support having a layer of developer material on the surface thereof. The color precursor reacts image-wise with the developer material to form a color in the form of the desired image.

The transfer of the acrylate to the receiver sheet can pose one or more problems. A first problem is that the acrylate may diffuse into and across the imaging sheet and blur and thereby reduce the intensity and clarity of the final image. A second problem is that a small amount of the acrylate monomer may remain on the surface of the receiver sheet. This is undesirable because some individuals are sensitive to acrylates.

Attempts have been made in the art to cure the deficiencies associated with acrylate transfer. Commonly assigned U.S. Pat. No. 4,483,912 teaches that the image diffusion problem can be reduced by including a curing agent in the microcapsule coating which reacts with the photohardenable composition released from the microcapsules and cures or otherwise hardens it. The curing agent is contained in the same microcapsules as the photohardenable composition or in separate photoinert microcapsules. The curing agent is typically a thermal initiator in that upon heating the agent generates free radicals to initiate polymerization of the released monomer.

Similarly, U.S. Pat. No. 4,784,932, assigned to Fuji Photo Film Co. teaches that the image diffusion problem can be reduced by including a curing agent in the developer material. As in the case with U.S. Pat. No. 4,483,912, the curing agent generates free radicals upon exposure to heat.

U.K. Published Specification No. 2,203,851 discloses a picture receptive material having a substrate, developer material and a hardener which can polymerize a polymerizable compound without the need for external energy. The hardening material is a compound having two or more nucleophilic groups in the molecule, and preferably a compound with functional imino, amino or sulfino groups. Although the additive materials according to this reference can function to polymerize the released monomer, the image quality produced is significantly reduced when the additives are used in association with acidic developer materials. More particularly, the basic nature of the amine and imine additive materials can cause them to prematurely react with a phenolic resin. This premature reaction can inhibit the reaction between the developer material and color precursor, which is typically a basic material.

Accordingly, there continues to be a need in the art for a receiver sheet to be used in association with acrylate imaging systems wherein the receiver sheet can develop high quality images and polymerize released acrylic monomeric material without requiring additional radiation exposure steps.

SUMMARY OF THE INVENTION

In accordance with the present invention, a nucleophilic material capable of undergoing a Michael addition reaction is provided in an imaging system utilizing activated unsaturated ethylenically materials, such as acrylates for transferring a chromogenic material to a receiver sheet. The nucleophilic material reacts with the transferred photohardenable acrylate to convert it to a less volatile, higher molecular weight form. The nucleophilic material which cures or otherwise hardens the acrylate composition comprises an amine salt.

The amine salt is typically a salt derived from a compound including one or more primary or secondary amino groups. In a particularly preferred embodiment, the amine salt is a morpholine salt. Still more preferably it is a morpholine salt of a carboxylic acid or a phenol and most preferably of an aromatic acid compound having two or more hydroxy and/or carboxylic acid groups attached to the aromatic nucleus. For example, particularly good results may be obtained by utilizing a salt of 2,4-dihydroxybenzoic acid.

The amine salt may be associated with the imaging system in a number of different ways. In a first embodiment, the amine salt is admixed with the developer material and coated onto the receiver sheet. In a second embodiment, the amine salt is coated onto a receiver support and is overcoated with a developer material. In a third embodiment, the amine salt overcoats the developer layer. In a fourth embodiment, the amine salt may be located on the imaging sheet by encapsulating the amine salt separately such that the microcapsule walls prevent premature reaction of the respective components. In still another embodiment, the amine salt may be directly chelated to a developer material which comprises a metal which is also chelated to one or more acidic compounds capable of reacting with a color precursor to form a visible image. In this embodiment, the metal is preferably zinc.

In accordance with one embodiment, the present invention comprises a receiver sheet comprising a support having a developer material and an amine salt mixed therewith or on the surface thereof, the developer material being capable of reacting with a color precursor to produce a visible image and the amine salt being capable of reacting with a photohardenable composition comprising an activated unsaturated ethylenic compound by a Michael addition.

The receiver sheet may either be paper or a transparent support. The latter support is preferred for use in producing overhead transparencies. In a particular embodiment, the developer material is a finely divided thermoplastic material capable of coalescing into a thin film which imparts gloss to the image upon the application of heat and/or pressure. When this developer material is used in association with the transparent polymeric film substrate, the presence of the amine salt may actually aid in the coalescing of the developer material into a thin transparent film, causing a reduction in haze.

In still another embodiment of the present invention, a receiver sheet is provided. The sheet comprises a support having a developer material, the developer material comprising a metal chelated to both one or more acidic compounds capable of reacting with a color precursor to produce a visible image and to one or more amine salts capable of reacting with an activated unsaturated ethylenic compound carrying the color precursor by a Michael addition reaction.

In a further embodiment an imaging system is provided. The imaging system is a transfer imaging system comprising:

an imaging sheet including a color precursor maintained in a photohardenable composition comprising an activated unsaturated ethylenic compound;

a receiver sheet including a developer material capable of forming visible images upon reaction with said color precursor; and an amine salt which is capable of reacting with said photohardenable composition by a Michael addition, said amine salt being associated with said imaging sheet and said receiver sheet such that said amine salt does not react with said photohardenable composition until after said color precursor has been transferred to said receiver sheet.

In a particularly preferred embodiment, the photohardenable composition and the color precursor of the imaging sheet are maintained in microcapsules.

DETAILED DESCRIPTION OF THE INVENTION

While describing the preferred embodiment, certain terminology will be utilized for the sake of clarity. The use of such technology is intended to encompass not only the recited embodiments but all technical equivalents which operate in a similar manner, for a similar purpose, to achieve a similar result.

Imaging systems utilizing photosensitive microcapsules are described in U.S. Pat. Nos. 4,399,209, 4,440,846 and 4,772,541. Preferred developer materials are disclosed in U.S. application Ser. Nos. 086,065, filed Aug. 14, 1987; 076,036, filed July 14, 1987; and 152,685, filed Feb. 5, 1988.

The amine salt, which may be associated with either the imaging sheet, the receiver sheet or as part of the developer material itself is capable of undergoing nucleophilic addition with an activated unsaturated ethylenic compound. In practice, the amine salt includes one or more primary amino or secondary amino groups. Any amine material which is capable of undergoing a nucleophilic reaction with the activated unsaturated ethylenic compound may be selected Examples include primary aliphatic amines, primary aromatic amines, secondary aliphatic amines and secondary aromatic amines Particularly preferred salts are derived from aliphatic amines, although other amines or compounds or polymers derived from imines such as aromatic amines, polymeric amines and cyclic amines may be selected. Salts derived from aliphatic cyclic amines are still more particularly preferred because of the ease of electron transfer associated with these materials. Examples of suitable materials include salts derived from morpholine, piperidine and polyethylimine. Other materials include functionalized amines capable of crosslinking through the reaction with other compounds, such as isocyanates. Examples of such functionalized amines include 1,2-dihydroxyamines. An additional class of compounds which may be used includes compounds containing a single amine moiety and a single hydroxyl group such as 2-amino-2-methyl-1-propanol. These compounds can react with isocyanates to undergo nucleophilic addition. Simple amines such as methylamine, ethanol amine and ethylamine may be selected, as can polyfunctional amines including two or more primary or secondary amine groups. Of the above listed compounds, amine salts derived from morpholine are particularly good materials.

The amine salt is an amine salt of an acid, preferably an aromatic acid. While not wishing to be bound by any scientific theory, it is hypothesized that the acidic compound can act as a catalyst to improve the Michael reaction between the amine salt and the acrylate or methacrylate. It is theorized that the acidic second compound may actually form an adduct with the acrylate material. The amine portion of the amine salt then protonates the adduct to form a stable, more desirable species.

Examples of acids which may be selected to form the amine salt include aromatic compounds of formula (I)

m is an integer equal to 0, 1 or greater;
n is an integer equal to 1 or greater;
X represents a COOH group and Y represents an OH group.

Specific examples include salicylic acid and 2,4-dihydroxybenzoic acid. Other acids which may be selected include benzoic acid, anthranilic acid and inorganic acids such as hydrochloric acid. Particularly good results have been obtained when utilizing 2,4-dihydroxybenzoic acid in combination with morpholine to produce a morpholine salt. While not wishing to be bound, the inventors hypothesize that the phenoxy anion generated from the acid may additionally react with the activated unsaturated ethylenic compound. A preferred ratio is 6 parts by mole of morpholine salt to 1 to 6 parts 2,4-dihydroxybenzoic acid, with a ratio of 3 to 1 being particularly preferred.

As stated above, the amine salts are associated with imaging systems including imaging materials which comprise a photohardenable composition comprising an activated ethylenic unsaturated compound, such as an acrylic or methacrylic acid or ester, and a chromogenic precursor. As detailed in the above-referenced patents, these acrylic or methacrylic materials are generally free radical addition polymerizable or cross-linkable compounds which undergo an increase in viscosity upon exposure to actinic radiation. They are typically associated with photoinitiators and often are maintained in microcapsules.

The acrylic or methacrylic compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate and combinations thereof. Other activated unsaturated ethylenic compounds include unsaturated anhydrides and compounds including nitrile groups.

The reaction mechanism between the morpholine salt of 2,4-dihydroxybenzoic acid and an acrylate is shown by the following equations.

polynuclear aromatic compounds, chlorosulfonyl and chloromethyl heterocyclic compounds, chlorosulfonyl and chloromethyl benzophenones and fluorenones, and haloalkanes. For use as visible light photoinitiators, the reactive dyecounter ion photoinitiators disclosed in U.S. Pat. Nos. 4,772,530 and 4,772,541 are particularly preferred.

It is possible to use various compounds as the chromogenic materials in the present invention. If the chromogenic material is encapsulated with the photosensitive composition, it should not interfere with the sensitivity of the system. One example of a class of particularly preferred chromogenic materials useful in the invention is colorless electron donating compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone, Copikem X, IV and XI (products of Hilton-Davis Co.) and commercially available cyan, yellow and magenta color forming agents are often used alone or in combination as color precursors in the present invention.

When the photohardenable composition and chromogenic precursor are encapsulated, the photosensitive microcapsules used in the present invention are easily formed using conventional techniques such as coacervation, liquid-liquid phase separation, interfacial polymerization and the like. Various melting, dispersing and cooling methods may also be used. In addition to the methods described in U.S. Pat. No. 4,399,209 and

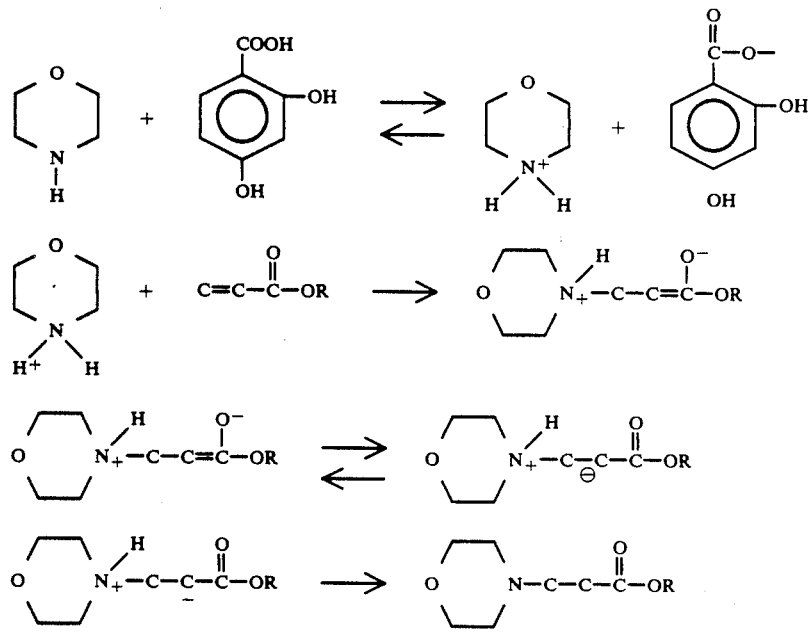

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, 0-acylated oximinoketones, polycyclic quinones, benzophenones and substituted benzophenones, xanthones, thioxanthones, halogenated compounds such as chlorosulfonyl and chloromethyl 4,772,541, one method for forming microcapsules which is particularly useful is described in U.S. application Ser. No. 370,103, filed June 22, 1989.

Also present in the inventive system is a receiver sheet which comprises a support including a developer material which is coated onto or maintained throughout the support. In practice the support is either a paper substrate or a transparent substrate, such as a polyethylene terephthalate film.

The developer material selected can comprise any material which is capable of reacting with the chromogenic precursor to form a visible image. These include conventional developer materials used in carbonless paper technology including acid clay, active clay, attapulgite, etc.; organic acids such as tannic acid, gallic acid, propylgallate; aromatic carboxylic acids such as benzoic acid, p-tertbutyl-benzoic acid, 4-methyl-3-nitrobenzoic acid, salicylic acid, 3-phenyl salicylic acid, 3-cyclohexyl salicylic acid, 3-tert-butyl-5-methyl salicylic acid, 3,5-di-tert-butyl salicylic acid, 3-methyl-5-benzyl salicylic acid, 3-phenyl-5-($\alpha,\alpha$-dimethylbenzyl) salicylic acid, 3-cyclohexyl-5-$\alpha,\alpha$-dimethylbenzyl) salicylic acid, 3-($\alpha,\alpha$-dimethylbenzyl) -5-methyl salicylic acid, 3,5-dicyclohexyl salicylic acid, 3,5-di-$\alpha$-methylbenzyl) salicylic acid, 3, 5-di-($\alpha,\alpha$-dimethylbenzyl) salicylic acid, 3-($\alpha$-methyl-benzyl), 5-($\alpha,\alpha$-dimethylbenzyl)salicylic acid, 4-methyl-5-cyclohexyl salicylic acid, 2-hydroxy-l-benzyl3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylenebis(4-chloro-m-cresol) as disclosed in Japanese Pat. Publications No. 9,309 of 1965 and 20,144 of 1967, and Japanese Laid Open Pat. Publication No. 14,409 of 1973; phenol resins such as phenol-aldehyde resins e.g., p-phenyl-phenol-formaldehyde resin and phenol-acetylene resins, e.g., p-tert-butylphenol-acetylene resin, and polyvalent metallic salts thereof such as zinc modified phenyl formaldehyde resin as disclosed in U.S. Pat. No. 3,732,120; acid polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052.

The phenolic resins may be further modified to include amounts of unsubstituted or substituted salicylic acids in a manner known in the art.

Another class of phenolic resin useful in the present invention is the product of oxidative coupling of substituted or unsubstituted phenols or bisphenols. Oxidative coupling may be catalyzed by various catalysts but a particularly desirable catalyst is the enzyme, horseradish peroxidase as described in commonly assigned U.S. Pat. No. 4,647,952, and more particularly the product of oxidative coupling of bisphenol A.

Especially preferred developer materials are phenol-formaldehyde condensation products. More particularly, alkylphenolic resins and, still more particularly, metallated products of alkyphenolic resins are preferred. The alkyl phenols are preferably monosubstituted by an alkyl group which may contain 1 to 12 carbon atoms. Examples of alkyl phenols are ortho- or para-substituted ethylphenol, propylphenol, butylphenol, amylphenol, hexylphenol, heptylphenol, octylphenol, nonylphenol, tbutylphenol, t-octylphenol, etc.

Another class of thermoplastic developer material which may be practiced within the scope of the present invention is a resin-like condensation product of a polyvalent metal salt, such as a zinc salt, and a phenol, a phenol-formaldehyde condensation product, or a phenolsalicylic acid-formaldehyde condensation product. This developer material is available from Schenectady Chemical Co. under the designation HRJ 4250 and HRJ 4542. These products are reported to be a metallated condensation product of an ortho- or para-substituted alkylphenol, a substituted salicylic acid, and formaldehyde. These materials are described in greater detail in U.S. application Ser. No. 073,036, filed July 14, 1987.

An alternative developer material comprises a thermoplastic vinyl or acrylic polymer having pendant developer moieties. These materials are described in greater detail in allowed U.S. application Ser. No. 086,059, filed Aug. 14, 1987.

Another alternative developer material comprises the combination of two materials capable of reacting with the chromogenic precursor. The first developer material is a finely divided thermoplastic phenolic resin as described above and the second developer material is a finely divided thermoplastic vinylic or acrylic resin containing pendant developer moities, as described above. These types of developers materials are discussed in greater detail in U.S. application Ser. No. 152,685, filed Feb. 5, 1988. The developer composition, in addition to being capable of reacting with the chromogenic precursor is capable of coalescing to form a scratch resistant, non-tacky film upon heating.

In one embodiment of the present invention, a developer material which is capable of reacting both with a chromogenic precursor and an activated unsaturated ethylenic compound is provided. This material comprises a metal material which is chelated to both the developer as well as the amine salt. The preferred metal material is zinc, which may be chelated to the carboxy function of a carboxylic acid, such as salicylic acid, and to the amine function of a secondary or primary amine compound, for example morpholine. When a chromogenic precursor comes into contact with the developer compound, the compound reacts with the precursor to form a visible image and hardens the activated compound to form a higher molecular weight species. Those skilled in the art will appreciate that other metal chelates, such as those which can be chelated to two morpholine functionalities may be selected as developer materials.

The amine salt can be associated with either the receiver sheet or the imaging sheet as long as the amine salt does not react with the activated compound prior to transfer. In the embodiment where the amine salt is chelated to a metal developer composition, the amine salt, by definition, is maintained on the receiver sheet. When the amine salt is located on the imaging sheet, it must be physically separated from the photohardenable composition. This can be accomplished by maintaining either the photohardenable compound or the amine salt, or both, in microcapsules. For example, the photohardenable composition may be maintained in pressure rupturable microcapsules while the amine salt may be contained in the binder or in a separate layer of microcapsules. Alternatively, the amine salt may be maintained in microcapsules and the photosensitive composition coated around the microcapsules.

When coated on the receiver sheet, the amine salt may be associated with the sheet in a number of different ways. In a first embodiment, the amine salt may be directly mixed with the developer material and coated onto a support In a second embodiment, the developer material may first be coated onto the support and the amine salt, optionally including additional developer material, can then be coated onto the first developer layer. In a third embodiment, the amine salt, optionally including developer material, is overcoated with a layer of developer material. This embodiment is particularly preferred as it has been discovered that upon transfer, the chromogenic precursor, typically a leuco dye, tends to only penetrate the upper portions of the receiver sheet whereas the acrylate or methacrylate tends to migrate through the upper portions of the receiver sheet and towards the opposite side of the substrate material. By maintaining only developer material at the upper portion of the receiver sheet, image density is at a maximum because the chromogenic precursor only contacts developer material, thereby maximizing the reactive area. Conversely, by maintaining the amine salt at a location below the upper surfaces of the receiver sheet, the amine salt/acrylate or methacrylate reaction does not interfere with the chromogenic precursor/leuco developer reaction. As a result potential imaging defects such as bleeding and feathering which may occur due to the presence of the carrier material are minimized.

When the amine salt is mixed with a reactive developer material it is usually present in an amount of about 1 to 25 parts amine salt per 100 parts of solid developer material when the amine salt is used in a separate layer, it is generally applied in an amount of about 2 to 10 g/m².

When producing receiver sheets which are to be used as overhead transparencies, several problems must be considered. A first consideration is that the developer layer which is coated onto the polymeric substrate be uniformly coated. If the developer material is not uniformly coated, surface defects commonly referred to as "fish eyes" may be produced, resulting in an inferior product. A further, and particularly important consideration when producing transparent receiver sheets is that the developer material coated onto the polymeric substrate be capable of forming a thin transparent film. As should readily be apparent, unless the polymeric receiver sheet is capable of forming a completely transparent image (except in areas where the color precursor has reacted with the developer layer) an inferior, and in some instances, unusable product will be produced, as the non-imaged areas will have a high degree of haze.

It has surprisingly been discovered that the inclusion of the amine salt in the developer layer can reduce the haze of the background after image development and glossing. It is hypothesized that the amine salt, when part of a developer material coated onto a transparent polymeric substrate acts as a plasticizer material. This is in stark comparison to materials which include amine or imine compounds, not salts, into the developer material coating.

The present invention is illustrated in more detail by the following non-limiting examples.

EXAMPLE 1

To determine whether the addition of an amine salt to a receiver substrate would reduce the level of trimethylolpropane triacrylate (TMPTA) on the substrate, imaging sheets including microcapsules having the following internal phases were assembled with two different receiver sheets and subjected to pressure contact.

Internal Phase I 150 parts Trimethylolpropane triacrylate (TMPTA)
18 parts BASF Reakt Yellow 186
0.9 parts 7-Diethylamino-3-cinnamoylcoumarin
1.5 parts 2,6-Diisopropyl-N,N-dimethylaniline (DIDMA)
10 parts Baymicron Isocyanates

Internal Phase II 120 parts TMPTA
30 parts Dipentaerythritol Hydroxypentaacrylate (DPHPA)
36 parts Hilton Davis HD5100 (magenta color former)
0.65 parts 1,1-di-n-heptyl-3,3,3',3'-tetramethylindocarbocyanine triphenyl-n-butylborate (phase II initiator)
0.5 parts DIDMA
10 parts Baymicron Isocyanates
0.0375 parts 2,6-di-t-butyl-4-methylphenol (BHT)

Internal Phase III 120 parts TMPTA
30 parts DPHPA
36 parts Hilton Davis HD5100 (magenta color former)
0.8 parts Phase II Initiator
10 parts Baymicron Isocyanates
0.0375 parts BHT

Internal Phase IV 105 parts TMPTA
45 parts DPHPA
18 parts Hilton Davis HD5430 (cyan color former)
2.5 parts 1,1'-di-n-heptyl-3,3,3',3'-tetramethylindodicarbocyanine triphenyl-n-butylborate
0.5 parts DIDMA
10 parts Baymicron Isocyanates
0.0375 parts BHT The capsules were coated onto the imaging substrates coated in the following ratio:

33.70 parts Internal Phase I
11.83 parts Internal Phase II
11.83 parts Internal Phase III
42.64 parts Internal Phase IV Two receiver sheets were prepared. The first receiver sheet comprised a polyethylene terephthalate substrate coated at a level of 8g/m² with a developer layer including 11.73 parts of HRJ-4542 thermoplastic developer resin available from Schenectady Chemical Co., 0.09 parts of Aerosol TO-75 (a sodium dioctyl sulfosuccinate surfactant manufactured by American Cyanamide) and 8.18 grams of water. The second receiver sheet had a developer layer coated at a level of 8g/m² containing the above developer materials and about 1.17 parts of a morpholine-2,4-dihydroybenzoic acid salt. The salt was prepared by adding 21.78 parts of morpholine, 19.27 parts of 2,4-dihydroxybenzoic acid (2 moles morpholine/1 mol acid) and 25 parts of deionized water to a beaker and stirring the materials until all of the acid dissolved.

A strip (1"×6") of the highest image density area of each of the receiver sheets (with and without morpholine2,4-dihydroxybenzoic acid salt) was placed in a separate jar (8 ounces) containing 50 ml of methanol, a good solvent for TMPTA. The jars were swirled for 15 minutes to provide good contact between the strips and the methanol, the samples were filtered in a syringe with a 0.2 micron millipore filter and the filtered sample was placed into a 2 ml gas chromatograph vial for high pressure gas chromatography testing. The samples were tested and analyzed against a control including 196 ppm of TMPTA in methanol. The results obtained are shown in Table 1.

TABLE 1

| Sample | ppm TMPTA |
| --- | --- |
| Control | 196 |
| Receiver sheet not including morpholine-2,4-dihydroxybenzoic acid salt | 51.8 |
| Receiver sheet including 10% morpholine 2,4-dihydroxybenzoic acid salt | 32.1 |

As seen by the data in Table 1, the presence of 10% morpholine-2,4-dihydroxybenzoic acid salt (by weight of the developer material) reduces the amount of TMPTA by about 40 percent as compared to a sample which does not include the salt.

EXAMPLES 2-8

An amine salt was prepared by mixing together 32.67 grams of morpholine, 19.27 grams of 2,4-dihydroxybenzoic acid and 25 grams of water. This produced a salt having a molar ratio of morpholine to 2,4-dihydroxybenzoic acid of 3 to 1. Developer compositions were produced by mixing together selected amounts of the amine salt with Schenectady Chemicals phenolic resin HRJ-4542, Aerosol TO-75 and water. The formulations are shown in Table 2.

TABLE 2

| Formulation | HRJ-4542 | OT-75 | $H_2O$ | Amine Salt | % Amine Salt (Solids) |
| --- | --- | --- | --- | --- | --- |
| 2 | 11.73 g | .09 g | 8.18 g | 0 g | 0% |
| 3 | 11.50 | .09 | 8.20 | .21 | 2% |
| 4 | 11.26 | .09 | 8.24 | .41 | 4% |
| 5 | 11.03 | .09 | 8.26 | .62 | 6% |
| 6 | 10.79 | .09 | 8.29 | .83 | 8% |
| 7 | 10.32 | .09 | 8.35 | 1.24 | 12% |
| 8 | 9.84 | .09 | 8.41 | 1.66 | 16% |

Each of the formulations 2-8 was separately coated on polyethylene terephthalate film at a level of $8g/m^2$ to form a receiver sheet and brought into pressure contact (380 pounds per linear inch, 22m/sec) with imaging sheets of example 1. After transfer, the receiver sheet was heated to 130° C. D max was measured and the Gardner Haze Index value was measured by using a Gardner Laboratory Division XL-800 Series machine for each of the samples. The values are shown in Table 3. A lower Gardner Haze Index value indicates higher transparency.

| Sample | % Amine Salt | Dmax | Gardner Haze Index |
| --- | --- | --- | --- |
| 2 | 0 | .68-.71 | 7.27 |
| 3 | 2 | .72-.75 | 4.07 |
| 4 | 4 | .70-.72 | 3.50 |
| 5 | 6 | .65-.68 | 3.13 |
| 6 | 8 | *.57-.58 | 3.43 |
| 7 | 12 | *.52-.54 | 3.40 |
| 8 | 16 | *.35-.37 | 4.03 |

*Sample had a bluish tint, indicating yellow dye fade

EXAMPLES 9-11

In these Examples, a receiver sheet was prepared by first coating polyethylene terephthalate base stock with a layer of developer material optionally including an amine salt at a level of about 4.7 $g/m^2$ and then overcoating the first coating layer with a coating layer including only developer material at a level of about 4.5 $g/m^2$. The formulation used for each of the samples is shown in Table 4.

TABLE 4

| Sample | First Coating Layer | % Amine Salt | Overcoat Layer |
| --- | --- | --- | --- |
| 9 | Formulation 2 | 0 | Formulation 2 |
| 10 | Formulation 5 | 6 | Formulation 2 |
| 11 | Formulation 7 | 12 | Formulation 2 |

The experiment of Examples 2-8 was repeated on Samples 9-11 to determine Dmax and the Gardner Haze Index and the experiment of Example 1 was repeated on Samples 9-11 to determine the amount of TMPTA present after transfer and development. The results are shown in Table 5.

TABLE 5

| Sample | Dmax | Haze | ppm TMPTA |
| --- | --- | --- | --- |
| 9 | .65-.68 | 5.40 | 60 |
| 10 | .62-.66 | 4.70 | 48 |
| 11 | .56-.61 | 4.70 | 32.5 |

EXAMPLES 12-16

The experiments of Examples 9-11 were repeated except that, for use as the amine salt, a salt prepared from morpholine and HCl was utilized. The molar relationship of morpholine to HCl was 1:2. The results are shown in Table 6.

TABLE 6

| Sample | % amine salt | Dmax | Haze | ppm TMPTA |
| --- | --- | --- | --- | --- |
| 12 | 0 | .61-.66 | 5.30 | 74 |
| 13 | 2 | .59-.63 | 4.50 | 46 |
| 14 | 4 | .57-.60 | 3.90 | 37 |
| 15 | 8 | .47-.49 | 4.17 | 36 |
| 16 | 12 | .37-.46 | 4.00 | 27 |

As demonstrated by the Examples, the addition of an amine salt to imaging systems containing acrylates functions to reduce the availability of the acrylate after development. Moreover, the resulting image density is not significantly reduced by the presence of the salt. This is in sharp contrast to systems which add only amine materials (not salts) as the densities of the produced images are reduced as a result of the basicity of the amine materials, which react with the acidic developer materials. In addition, the presence of amine salt when used in association with a transparent substrate can reduce the haze of the final product, thereby making it a more commercially attractive alternative.

Having described the invention in detail and by reference to preferred embodiments thereof, it will be apparent that modifications and variations are possible without departing from the scope of the invention defined in the appended claims.

What is claimed is:

1. A transfer imaging system comprising:
   an imaging sheet including a color precursor maintained in a photohardenable composition comprising an activated unsaturated ethylenic compound;
   a developer material capable of forming visible images upon reaction with said color precursor; and
   an amine salt capable of reacting with said photohardenable composition by a Michael addition reaction, said amine salt being associated with said imaging sheet such that said amine salt does not react with said photohardenable composition until after said color precursor has been communicated with said developer material, wherein said amine salt is a salt of an aromatic acid compound, and wherein said aromatic acid compound is of formula (I)

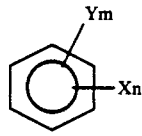

where m is an integer equal to 0, 1, or greater;
n is an integer equal to or greater than 1;
X represents a COOH group and Y represents an OH group.

2. The transfer imaging system according to claim 1 wherein said amine salt is a morpholine salt.

3. The transfer imaging system according to claim 1 wherein said aromatic compound comprises 2,4-dihydroxy benzoic acid.

4. The transfer imaging system according to claim 3 wherein said amine salt is a salt of morpholine and wherein the molar ratio of said morpholine salt to said acid ion derived from 2,4-dihydroxybenzoic acid ranges from about 6:1-6.

5. The transfer imaging system according to claim 1 which further includes a receiver sheet and wherein said amine salt is admixed with said developer material and located on said receiver sheet.

6. The transfer imaging system according to claim 1 which further includes a receiver sheet and wherein said amine salt is located on said receiver sheet support as a first coating layer and wherein said developer material overcoated on said amine salt coating layer.

7. The transfer imaging system according to claim 1 which further includes a receiver sheet and wherein said developer material is coated as a layer on said receiver sheet and wherein said amine salt is overcoated on said developer material.

8. The transfer imaging system according to claim 1 wherein at least one of said photohardenable composition and said amine salt are separately maintained in microcapsules.

* * * * *